(12) United States Patent
Pan

(10) Patent No.: US 10,568,225 B2
(45) Date of Patent: Feb. 18, 2020

(54) WATERPROOF STRUCTURE OF COLD AISLE CABINET

(71) Applicants: HKC Corporation Limited, Shenzhen, Guangdong (CN); Chongqing HKC Optoelectronics Technology Co., Ltd., Chongqing (CN)

(72) Inventor: Po-Sung Pan, Chongqing (CN)

(73) Assignees: HKC Corporation Limited, Shenzhen (CN); Chongqing HKC Optoelectronics Technology Co., Ltd., Chongqing (CN)

(*) Notice: Subject to any disclaimer, the term of this patent is extended or adjusted under 35 U.S.C. 154(b) by 0 days.

(21) Appl. No.: 16/317,563

(22) PCT Filed: Aug. 9, 2017

(86) PCT No.: PCT/CN2017/096670
§ 371 (c)(1),
(2) Date: Jan. 13, 2019

(87) PCT Pub. No.: WO2018/133394
PCT Pub. Date: Jul. 26, 2018

(65) Prior Publication Data
US 2019/0261528 A1  Aug. 22, 2019

(30) Foreign Application Priority Data

Jan. 18, 2017  (CN) .......................... 2017 1 0036098

(51) Int. Cl.
*H05K 5/02*  (2006.01)
*H05K 5/03*  (2006.01)
*H05K 7/20*  (2006.01)

(52) U.S. Cl.
CPC ........... *H05K 5/03* (2013.01); *H05K 7/20709* (2013.01)

(58) Field of Classification Search
None
See application file for complete search history.

(56) References Cited

U.S. PATENT DOCUMENTS 6,417,443 B1 *  7/2002  Smith .................... H02B 1/565
                                                   174/17 VA
7,500,911 B2 *  3/2009  Johnson ............. H05K 7/20836
                                                   165/104.33

(Continued)

FOREIGN PATENT DOCUMENTS

| CN | 202818821 U | 3/2013 |
| CN | 204202822 U | 3/2015 |
| CN | 204616238 U | 9/2015 |

OTHER PUBLICATIONS

International Search Report of PCT Patent Application No. PCT/CN2017/096670 dated Nov. 10, 2017.

*Primary Examiner* — Courtney L Smith

(57) ABSTRACT

Disclosed is a waterproof structure of a cold aisle cabinet. The waterproof structure of a cold aisle cabinet includes a cabinet group which includes a plurality of cabinets, a first covering plate parallelly defined above the cabinet group, and a support frame defined between the first covering plate and the cabinet group, the support frame being mounted on the cabinet group and abutting against the side of the first covering plate facing the cabinet group; the area of the top surface of the first covering plate is larger than or equal to the area of the top surface of the cabinet group.

19 Claims, 4 Drawing Sheets

(56) References Cited

U.S. PATENT DOCUMENTS

| | | | |
|---|---|---|---|
| 8,405,977 B2* | 3/2013 | Lin | H05K 7/20736 312/223.2 |
| 8,427,830 B2* | 4/2013 | Absalom | H05K 7/20745 361/679.51 |
| 8,441,789 B2* | 5/2013 | Wu | H05K 7/20827 361/679.49 |
| 8,537,539 B2* | 9/2013 | Doll | H05K 7/20736 361/679.5 |
| 9,888,614 B1* | 2/2018 | Ross | H05K 7/20736 |
| 10,375,843 B2* | 8/2019 | Boily | H02B 3/025 |
| 2006/0050470 A1* | 3/2006 | Eiselt | H02B 3/025 361/605 |
| 2009/0141432 A1* | 6/2009 | Kingston | H02B 3/025 361/676 |
| 2009/0251860 A1* | 10/2009 | Belady | H05K 7/1497 361/690 |
| 2017/0098924 A1* | 4/2017 | Trussler | H02B 3/025 |
| 2017/0261233 A1* | 9/2017 | Daniels | E04D 13/174 |

* cited by examiner

WATERPROOF STRUCTURE OF COLD AISLE CABINET

FIELD

The present disclosure relates to a waterproof structure of a cold aisle cabinet.

BACKGROUND

An information communication cabinet refers to a case or a cabinet used for integrated loading of various communication apparatus, and is generally made of high quality cold rolled steel plate. The cabinet system has solved the problems of high-density heat dissipation of communication apparatus, attachment and management of a large number of cables, large-capacity power distribution, and full compatibility with rack apparatus of different manufacturers, thus allowing the communication apparatus to operate in a highly stable status. High-power communication apparatus normally generates a large amount of heat during a long-term operation. Currently, to ensure heat dissipation, a cold aisle cabinet is employed to improve the heat dissipation of the cabinet. In general, the cold aisle cabinet is placed in a specific machine room, and the top of the machine room is usually covered with liquid pipelines, in this situation, if leakage occurs, the information system would collapse. Therefore, a waterproof structure is required in the machine room to protect the entire cabinet group. However, if a waterproof layer is covered on the whole top of the machine room, the area to be protected is too large, which would cause a high cost and a long construction period, and delaying the operation of the machine room.

SUMMARY

The present disclosure provides a waterproof structure of a cold aisle cabinet, which could maintain the dryness of the whole machine room where the cold aisle cabinet is placed.

The present disclosure provides a waterproof structure of a cold aisle cabinet, including:

a cabinet group, comprising a plurality of cabinets;

a first covering plate, parallelly disposed above the cabinet group, and the area of the top surface of the first covering plate being larger than or equal to the area of the top surface of the cabinet group; and a support frame, disposed between the first covering plate and the cabinet group, the support frame being mounted on the cabinet group and abutting against the side of the first covering plate facing the cabinet group.

Optionally, the waterproof structure further includes a second covering plate connecting to the first covering plate, the second covering plate is obliquely disposed along the length direction of the first covering plate, the connecting end of the second covering plate is higher than the free end of the second covering plate.

Optionally, the amount of the second covering plate is two, the two second covering plates are respectively disposed on two sides of the first covering plate.

Optionally, the waterproof structure further includes a third covering plate connecting to the first covering plate, the third covering plate is obliquely disposed along the width direction of the first covering plate, the connecting end of the third covering plate is higher than the free end of the third covering plate, and the third covering plate connects to the two second covering plates.

Optionally, the waterproof structure further includes a water guiding gutter configured to collect leakage, the water guiding gutter connects to the second covering plate, and is disposed at the lower end of the second covering plate.

Optionally, the waterproof structure further includes a leakage detector, the leakage detector is disposed in the water guiding gutter.

Optionally, the waterproof structure further includes an audible and visual alarm, the audible and visual alarm is electrically connected to the leakage detector.

Optionally, the water guiding gutter is detachably connected to the lower end of the second covering plate.

Optionally, the support frame is detachably fixed on the cabinet group.

Optionally, the first covering plate and the second covering plate are an integrated structure, using an integrally formed punching plate.

In the technical solution of the present disclosure, the waterproof structure includes a cabinet group which includes a plurality of cabinets, a first covering plate parallelly disposed above the cabinet group. The first covering plate and the cabinet group are provided with a support frame therebetween, the support frame is mounted on the cabinet group and abuts against the side of the first covering plate facing the cabinet group. The area of the top surface of the first covering plate is larger than or equal to the area of the top surface of the cabinet group. In the present disclosure, the first covering plate which could block water leakage is disposed above the cold aisle cabinet, so as to prevent the leakage water from dropping on the cold aisle cabinet and affecting the operation of the cabinet, maintaining the dryness of the environment in the machine room where the cold aisle cabinet is placed.

BRIEF DESCRIPTION OF THE DRAWINGS

In order to illustrate the technical solution in the embodiments of the present disclosure or the prior art more clearly, brief description would be made below to the drawings required in the embodiments of the present disclosure or the prior art. Obviously, the drawings in the following description are merely some of the embodiments of the present disclosure, and those skilled in the art could obtain other drawings according to the structures shown in the drawings without any creative efforts.

FIG. 2 is a front view of FIG. 1a;

Figure 1A:
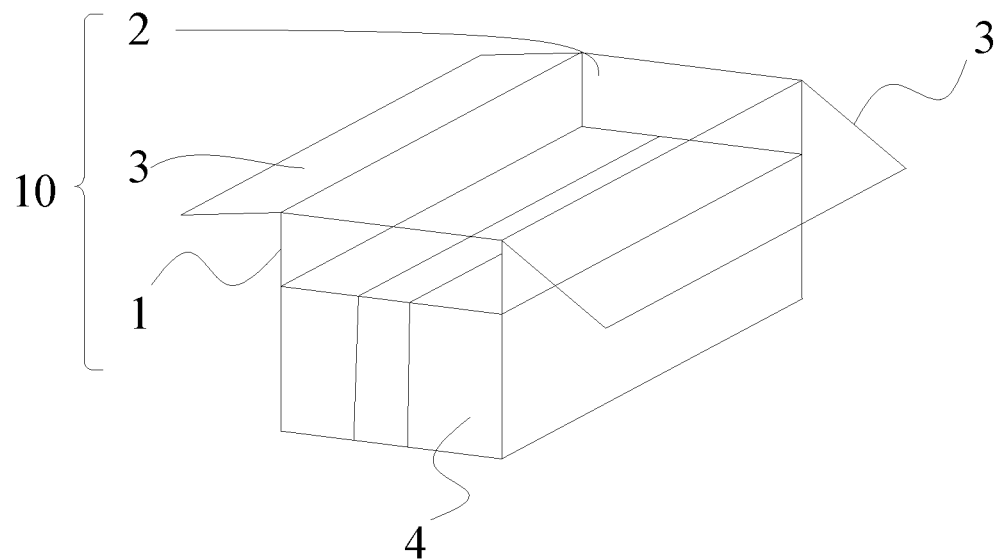
FIG. 1a is an illustrative diagram of a waterproof structure of a cold aisle cabinet of an embodiment according to the present disclosure.

The realizing of the aim, functional characteristics and advantages of the present disclosure are further described in detail with reference to the accompanying drawings and the embodiments.

DETAILED DESCRIPTION OF THE EMBODIMENTS

The technical solutions in the embodiments of the present disclosure will be described clearly and completely combining the drawings in the embodiments of the present disclosure. Obviously, the described embodiments are only a part of the embodiments of the present disclosure, but not all of them. Based on the embodiments in the present disclosure, all other embodiments obtained by those skilled in the art without creative work shall belong to the protection scope of the present disclosure.

It should be noted that, all directional indications (such as "upper", "lower", "left", "right", "front", "back" . . . ) in the embodiments of the present disclosure are only used to explain the relative positional relationship, motion, and the like, between components in a certain posture. If the particular posture changes, the directional indication changes accordingly.

In addition, terms such as "first" and "second" are used herein for purposes of description and are not intended to indicate or imply relative importance or to imply the number of indicated technical features. Thus, the features defined with "first" and "second" may comprise or imply at least one of these features. In the description of the present disclosure, "a plurality of" means two or more than two, unless specified otherwise.

In the present disclosure, unless specified or limited otherwise, the terms "connected", "fixed" and the like are used broadly, and may be, for example, fixed connections, detachable connections, or integral connections; may also be mechanical or electrical connections; may also be direct connections or indirect connections via intervening structures; may also be inner communications of two elements or interactions of two elements. For those skilled in the art, the specific meanings of the above terms in the present disclosure could be understood by those skilled in the art according to specific situations.

In addition, the technical solutions between the various embodiments of the present disclosure may be combined with each other, but must be based on the realization of those skilled in the art. When the combination of technical solutions is contradictory or impossible to implement, it should be considered that the combination of the technical solutions does not exist, and not within the scope of protection required by this disclosure.

The present disclosure provides a waterproof structure of a cold aisle cabinet.

Referring to FIGS. 1-6, in one embodiment of the present disclosure, the waterproof structure 10 of the cold aisle cabinet 4 includes a cabinet group 6 which includes a plurality of cabinets, and a first covering plate 2 parallelly disposed above the cabinet group 6. A support frame 1 is disposed between the first covering plate 2 and the cabinet group 6, the support frame 1 is mounted on the cabinet group and abuts against the side of the first covering plate 2 facing the cabinet group 6. The area of the top surface of the first covering plate 2 is larger than or equal to the area of the top surface of the cabinet group 6.

Figure 1B:
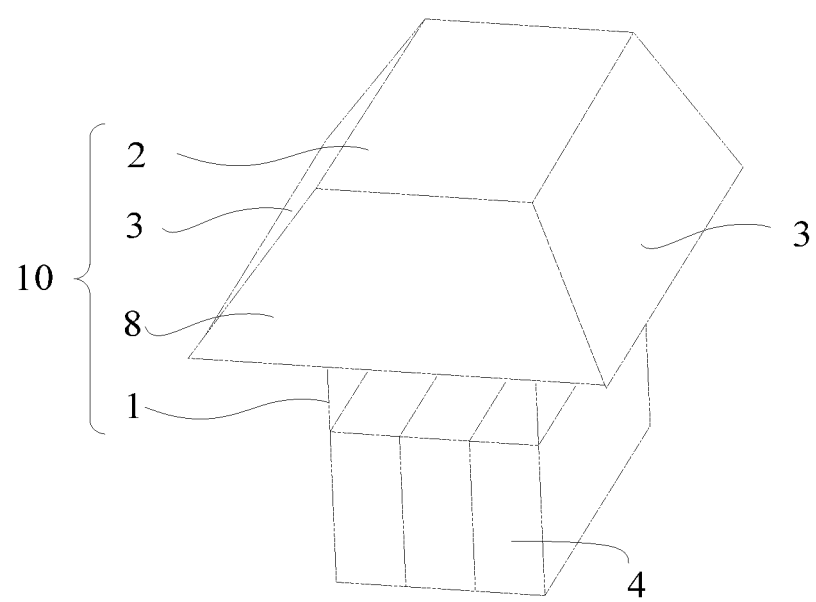
FIG. 1b is an illustrative diagram of a waterproof structure of a cold aisle cabinet of another embodiment according to the present disclosure.
Figure 2:
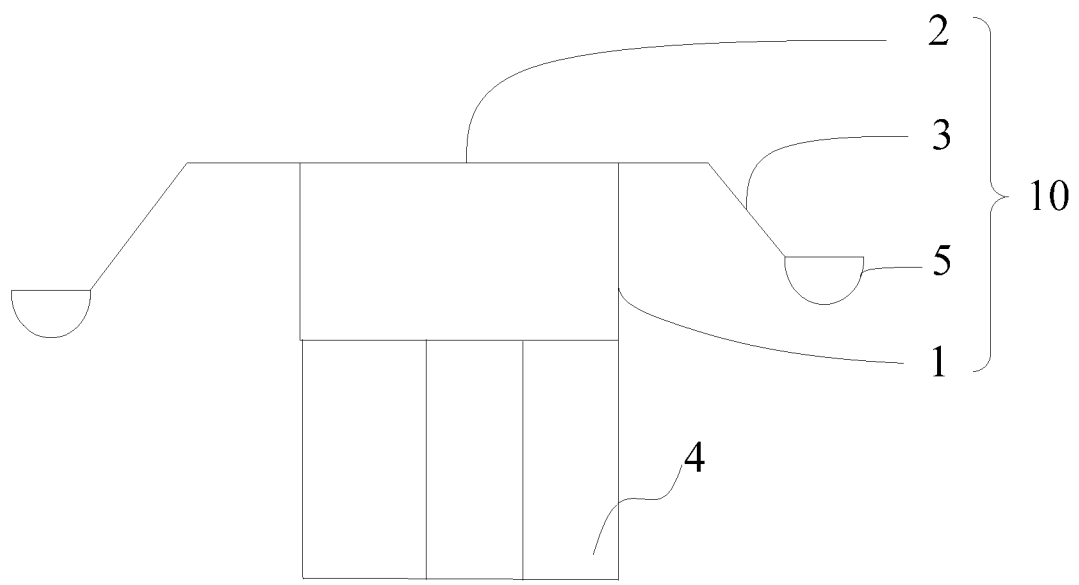
Figure 3:
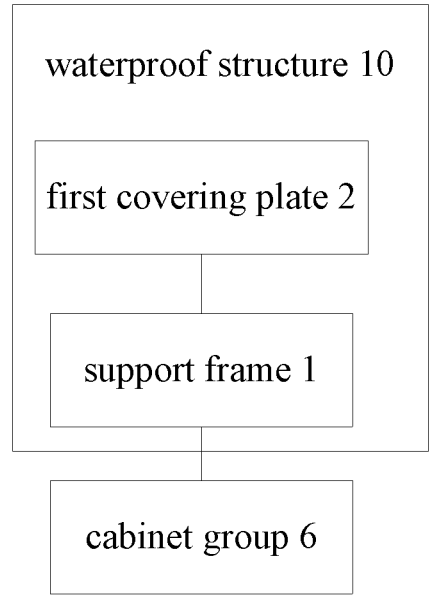
FIG. 3 is a module diagram of a waterproof structure of a cold aisle cabinet of an embodiment according to the present disclosure.

In this embodiment, referring to FIGS. 1-3, the first covering plate 2 is disposed above the cabinet group. The covering plate 2 is parallelly disposed above the cabinet group 6, and the area of the side of the first covering plate 2 parallel to the cabinet group 6 is larger than or equal to the area of the cabinet group 6 on this side, that is, the projection of the first covering plate 2 in the vertical direction could completely cover the cabinet group 6, so as to allow the first covering plate 2 to block the dripping water for the cabinet group 6. Specifically, the first covering plate 2 is disposed above the cabinet group 6 via the support frame 1 which is mounted on the cabinet group 6, and support frame 1 abuts against the side of the first covering plate 2 close to the cabinet group 6. By adopting the technical solution of the present disclosure, water leakage on the cabinet could be effectively prevented, and the first covering plate 2 is simple to install and low in cost. It should be noted that, the first covering plate 2 in this embodiment is , and the waterproof structure is disposed in a machine room where the cold aisle cabinet 4 is placed.

Further, the support frame 1 is detachably mounted on the cabinet group 6. In this embodiment, to facilitate the disassembly of the first covering plate 2, and to dissemble the waterproof structure in time when the cold aisle cabinet 4 needs to be constructed, the support frame 1 is detachably mounted on the cabinet group 6. By using the detachable support frame 1 in this embodiment, the waterproof structure 10 could be detached from the cabinet group 6 as needed, to avoid affecting construction, and convenient for use.

Figure 4:
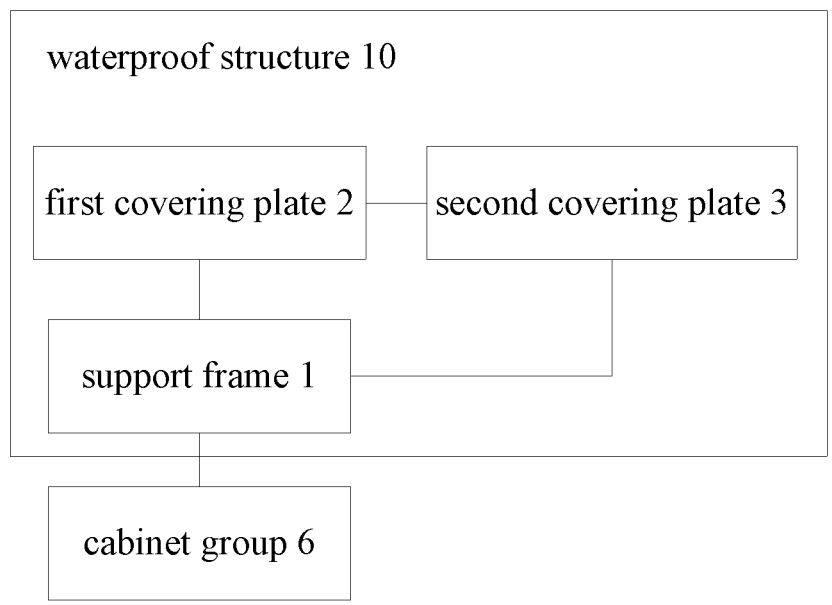
FIG. 4 is a module diagram of a waterproof structure of a cold aisle cabinet of another embodiment according to the present disclosure.

To discharge the water dripping on the first covering plate 2 to the outside of the cold aisle cabinet 4, one side of the first covering plate 2 is provided with a second covering plate 3. The second covering plate 3 connects to the first covering plate 2, the connecting line of the second covering plate 3 and the first covering plate 2 is along the direction in which the cabinet is arranged, and the free end of the second covering plate 3 is inclined toward the direction away from the cabinet. Referring to FIG. 1 and FIG. 4, the technical solution of this embodiment is mainly for preventing excessive accumulation of water dripping on the first covering plate 2 and directly flowing from the side of the first covering plate 2 to a place close to the cabinet, making the machine room where the cabinet is placed too humid. In this embodiment, the free end of the second covering plate 3 is inclined toward the direction away from the cabinet, so that the dripping water accumulated on the first covering plate 2 could directly flow along the second covering plate 3 away from the cabinet.

Further, the amount of the second covering plate 3 is two, the two second covering plates 3 are respectively disposed on two sides of the first covering plate 2. Each of the two sides of the first covering plate 2 is respectively disposed one second covering plate 3, so as to guide water on the first covering plate 2 directly from the second covering plates 3 of both sides to the outside.

Optionally, the waterproof structure 10 further includes a third covering plate 8 connecting to the first covering plate 2. The connecting line of the third covering plate 8 connecting to the first covering plate 2 is perpendicular to the connecting line of the second covering plate 3 connecting to the first covering plate 2, the third covering plate 8 connects to the two second covering plates 3, and the free end of the third covering plate 8 is inclined toward the direction away from the cabinet. In this embodiment, the third covering plate 8 and the second covering plate 3 have the same function and arrangement means, the difference is the arrangement position. The third covering plates 8 are disposed on the other two sides of the first covering plate 2 not connecting to the two second covering plate 3, namely the connecting line of the third covering plate 8 and the first covering plate 2 is perpendicular to the connecting line of the second covering plate 3 and the first covering plate 2. With this structure, the first covering plate 2 is designed to be a structure that the four sides could drain the drip to where is away from the cabinet, so that the dripped water does not have a negative impact on the cold aisle cabinet 4.

Figure 5:
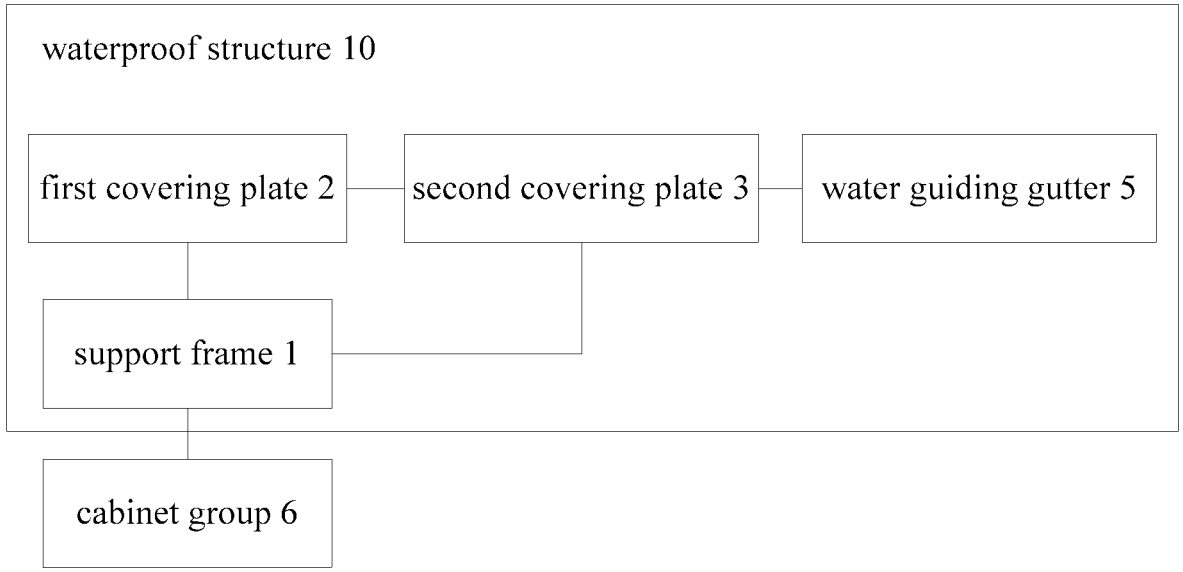
FIG. 5 is a module diagram of a waterproof structure of a cold aisle cabinet of another embodiment according to the present disclosure.

Referring to FIG. 5, in order to treat the water flowing down from the first covering plate 2, a water guiding gutter 5 for collecting leakage is disposed at the lower end of the second covering 3. By the arrangement of the water guiding gutter 5, the leakage could be collected in the water guiding gutter 5, instead of directly dropping in the room, and the leakage collected in the water guiding gutter 5 could be further treated. Further, the water guiding gutter 5 is detachably connected to the lower end of the second covering plate 3. The water guiding gutter 5 is detachably mounted at the lower end of the second covering plate 3, so that when leakage accumulates in the water guiding gutter 5, the water guiding gutter 5 could be disassembled to treat the water, thereby maintaining the dryness of the entire machine room where the cabinet is placed.

Figure 6:
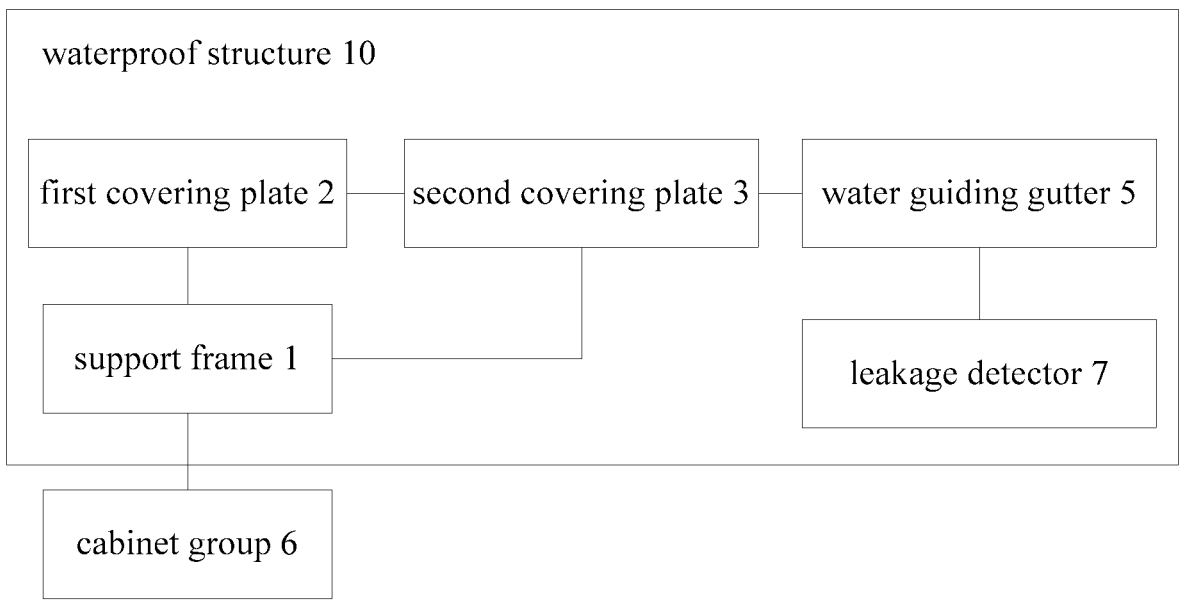
FIG. 6 is a module diagram of a waterproof structure of a cold aisle cabinet of another embodiment according to the present disclosure.

Further, referring to FIG. 6, the waterproof structure further includes a leakage detector 7, the leakage detector 7 is disposed in the water guiding gutter 5. The purpose of providing the leakage detector 7 is that, when the leakage accumulates in the water guiding gutter 5, the leakage detector 7 could sense that the leakage accumulates in the water guiding gutter 5, and then send signal to alert the worker to treat the leakage in the water guiding gutter 5 in time. The arrangement of the leakage detector 7 could provide a quick and convenient alert to the worker, further optimizing the environment in the machine room.

Optionally, the first covering plate 2 and the second covering plate 3 are an integrated structure, made of an integrally formed punching plate. The first covering plate 2 and the second covering plate 3 are integrally formed, which saves installation process during the installation, and facilitates the disassembly.

Further, the waterproof structure further includes an audible and visual alarm (not shown). The audible and visual alarm is electrically connected to the leakage detector. By the arrangement that the audible and visual alarm is electrically connected to the leakage detector, when the leakage detector detects the leakage accumulated in the water guiding gutter 5, the leakage detector could send a signal to the audible and visual alarm; and when the audible and visual alarm receives the signal from the leakage detector, the audible and visual alarm sends out an audible and visual signal in time, in this case, even if the worker is busy with work, they could immediately know the water leakage in the machine room, so as to take timely treatment, further maintaining the dry environment in the machine room.

The foregoing description merely portrays some illustrative embodiments in accordance with the disclosure and therefore is not intended to limit the patentable scope of the disclosure. Any equivalent structure or flow transformations that are made taking advantage of the specification and accompanying drawings of the disclosure and any direct or indirect applications thereof in other related technical fields shall all fall in the scope of protection of the disclosure.

What is claimed is:

1. A waterproof structure of a cold aisle cabinet, applied to a cabinet group comprising a plurality of cabinets, wherein, the waterproof structure comprises:
   a first covering plate, parallelly defined above the cabinet group, and the area of the top surface of the first covering plate being larger than or equal to the area of the top surface of the cabinet group; and
   a support frame, defined between the first covering plate and the cabinet group, the support frame being mounted on the cabinet group and abutting against the side of the first covering plate facing the cabinet group; and
   a second covering plate, connecting to the first covering plate;
   wherein the second covering plate is obliquely defined along the length direction of the first covering plate, the connecting end of the second covering plate is higher than the free end of the second covering plate.

2. The waterproof structure of claim 1, wherein, the amount of the second covering plate is two, the two second covering plates are respectively defined on two sides of the first covering plate.

3. The waterproof structure of claim 2, wherein, the waterproof structure further comprises a third covering plate connecting to the first covering plate, the third covering plate is obliquely defined along the width direction of the first covering plate, the connecting end of the third covering plate is higher than the free end of the third covering plate, and the third covering plate connects to the two second covering plates.

4. The waterproof structure of claim 2, wherein, the waterproof structure further comprises a water guiding gutter configured to collect leakage, the water guiding gutter connects to the second covering plate, and is defined at the lower end of the second covering plate.

5. The waterproof structure of claim 4, wherein, the waterproof structure further comprises a leakage detector, the leakage detector is defined in the water guiding gutter.

6. The waterproof structure of claim 5, wherein, the waterproof structure further comprises an audible and visual alarm, the audible and visual alarm is electrically connected to the leakage detector.

7. The waterproof structure of claim 4, wherein, the water guiding gutter is detachably connected to the lower end of the second covering plate.

8. The waterproof structure of claim 1, wherein, the support frame is detachably fixed on the cabinet group.

9. The waterproof structure of claim 1, wherein, the first covering plate and the second covering plate are an integrated structure, using an integrally formed punching plate.

10. A waterproof structure of a cold aisle cabinet, applied to a cabinet group comprising a plurality of cabinets, wherein, the waterproof structure comprises:
    a first covering plate, parallelly disposed above the cabinet group, and the area of the top surface of the first covering plate being larger than or equal to the area of the top surface of the cabinet group;
    a support frame, defined between the first covering plate and the cabinet group, the support frame being mounted on the cabinet group and abutting against the side of the first covering plate facing the cabinet group; and
    a second covering plate, connecting to the first covering plate;
    wherein a height of the second covering plate is configured to gradually decrease along a direction from a side of the first covering plate to an outer edge of the second covering plate.

11. The waterproof structure of claim 10, wherein, the second covering plate is obliquely defined along the length direction of the first covering plate, the connecting end of the second covering plate is higher than the free end of the second covering plate.

12. The waterproof structure of claim 11, wherein, the amount of the second covering plate is two, the two second covering plates are respectively defined on two sides of the first covering plate.

13. The waterproof structure of claim 11, wherein, the waterproof structure further comprises a third covering plate connecting to the first covering plate, the third covering plate is obliquely defined along the width direction of the first covering plate, the connecting end of the third covering plate is higher than the free end of the third covering plate, and the third covering plate connects to the two second covering plates.

14. The waterproof structure of claim 11, wherein, the waterproof structure further comprises a water guiding gutter configured to collect leakage, the water guiding gutter connects to the second covering plate, and is defined at the lower end of the second covering plate.

15. A waterproof structure of a cold aisle cabinet, applied to a cabinet group comprising a plurality of cabinets, wherein, the waterproof structure comprises:
a first covering plate, parallelly defined above the cabinet group, and the area of the top surface of the first covering plate being larger than or equal to the area of the top surface of the cabinet group;
a support frame, defined between the first covering plate and the cabinet group, the support frame being mounted on the cabinet group and abutting against the side of the first covering plate facing the cabinet group;
the waterproof structure further comprises a second covering plate connecting to the first covering plate, the connecting end of the second covering plate is higher than the free end of the second covering plate.

16. The waterproof structure of claim 15, wherein, the second covering plate is obliquely defined along the length direction of the first covering plate.

17. The waterproof structure of claim 15, wherein, the amount of the second covering plate is two, the two second covering plates are respectively defined on two sides of the first covering plate.

18. The waterproof structure of claim 15, wherein, the waterproof structure further comprises a third covering plate connecting to the first covering plate, the third covering plate is obliquely defined along the width direction of the first covering plate, the connecting end of the third covering plate is higher than the free end of the third covering plate, and the third covering plate connects to the two second covering plates.

19. The waterproof structure of claim 15, wherein, the waterproof structure further comprises a water guiding gutter configured to collect leakage, the water guiding gutter connects to the second covering plate, and is defined at the lower end of the second covering plate.

* * * * *